United States Patent [19]
Hung et al.

[11] Patent Number: 6,027,602
[45] Date of Patent: Feb. 22, 2000

[54] WET PROCESSING APPARATUS

[75] Inventors: Ching-Chang Alex Hung, Singapore, Singapore; Ta-Hsing Fu, Taiwan, Taiwan

[73] Assignee: Techpoint Pacific Singapore Pte. Ltd., Singapore, Singapore

[21] Appl. No.: 08/920,792

[22] Filed: Aug. 29, 1997

[51] Int. Cl.[7] .................................................. C23F 1/02
[52] U.S. Cl. ........................................... 156/345; 118/715
[58] Field of Search ............................ 156/345; 438/704, 438/905; 118/715

[56] References Cited

U.S. PATENT DOCUMENTS

| | | | |
|---|---|---|---|
| 4,557,785 | 12/1985 | Ohkuma | 156/345 |
| 5,571,367 | 11/1996 | Nakajima et al. | 156/345 |

*Primary Examiner*—R. Bruce Breneman
*Assistant Examiner*—Liza Pacheco
*Attorney, Agent, or Firm*—Lawrence Y. D. Ho; David D. Chung; Jacqueline C.T. Lui

[57] ABSTRACT

An apparatus for wet processing of substrates in a controlled environment. It is a single-substrate processing apparatus which is capable of carrying out etching, rinsing, and drying processes all in a single apparatus and in a controlled environment. A closed processing chamber is provided for processing a substrate in a closed environment. Processing liquids and gases are introduced into the chamber and the chamber is rotated with the substrate. Temperature inside the chamber is controlled by heating the gases. Humidity is controlled by varying the proportion of water vapor. The rotation of the chamber with the substrate creates a stable environment where processing parameters are more easily controlled.

13 Claims, 1 Drawing Sheet

WET PROCESSING APPARATUS

FIELD OF THE INVENTION

The present invention generally relates to the field of wet processing of substrates, and in particular, to an apparatus and method for wet processing silicon substrates in a controlled environment to facilitate an improved etch rate, uniformity, contamination reduction, and other performance enhancements.

BACKGROUND OF THE INVENTION

Wet processing of silicon substrates is well known in the art. It is a process where substrates are treated with liquid agents, such as etchant chemicals or water, to etch selective portions of the substrate, remove photoresist, clean, and to perform other functions generally related to the fabrication of semiconductor devices.

Currently, the etchant chemicals are introduced to the substrates in one of two ways. The first way, known as batch processing, is to immerse a batch of substrates in a chemical bath for a specified period of time and removing them from the bath for rinsing. The second way, known as one-to-one processing, is to flood a single substrate with a wet chemical spray and to spin the substrate on a chuck. These two methods can be used in conjunction with each other. A typical wet processing of substrates entails a series of steps where the substrate is exposed to one type of chemical, then rinsed or dried, exposed to a different type of chemical (if needed), and so on, until the desired pattern is formed on the surface of the substrate.

Currently, the wet processing of substrates is not a completely controlled process for two main reasons. First, the substrates being processed are exposed to environmental factors which may cause undesirable effects on the final product. Because the substrate processing is done in an open environment, factors such as humidity, temperature, and contamination levels are not precisely controlled. Control over these factors is important because they affect the processing parameters and consequently the final outcome. For instance, humidity can affect how quickly an etchant evaporates from the surface of the substrate. If the evaporation occurs too quickly, there may not have been enough exposure to sufficiently etch the substrate.

To avoid these environment-related problems, the system must be in a closed environment. However, currently, the closed environment is generally only found in the dry-processing systems such as plasma etching or ion etching systems. And while the dry etching systems generally do not suffer from some of the shortcomings discussed above, they have other shortcomings not present in the wet processing such as lack of selectivity. Hence, dry-processing does not provide a complete solution.

The second reason for failure to achieve a controlled environment aside from the open environment is the inability to precisely control the amount of exposure the substrate has with a particular chemical. Excessive exposure may cause excessive removal of the substrate or photoresist. Under-exposure, on the other hand, may cause not enough removal. Controlling the amount of exposure to the various chemicals has been difficult because it is generally difficult to controllably remove the residual liquid from the surface of the substrate when the exposure is deemed to have been enough. This is particularly true for batch processing since the etchant chemical trickles over the edge of the substrate when the substrate is removed from the chemical bath. Although the one-to-one processing has attempted to solve this problem, the existing systems generally have not been completely successful.

These and other shortcomings have lead to slower processing time and/or performance defects that contribute to the general slow down in the overall manufacturing of semiconductor devices, and the lowering of yield. Although some wet processing systems with closed environment do exist, they have failed to achieve the level of etching uniformity that can be achieved via the present invention. As of this date, there has not been an apparatus or method of utilizing the selectivity of wet processing with the environmental controllability of dry etching while providing superior uniformity. Therefore, it is easy to see the desirability of having an apparatus and method for facilitating a controlled environment for a wet processing of wafer substrates.

OBJECT OF THE INVENTION

It is therefore, an object of the present invention to provide a wet processing apparatus which can control the pertinent so as to achieve a superior result in the wet processing of a substrate.

SUMMARY OF THE INVENTION

The present invention is an apparatus for wet processing of substrates in a controlled environment. It is a single-substrate processing apparatus which is capable of carrying out etching, rinsing, and drying processes all in a single apparatus and in a controlled environment.

The present wet-processing apparatus comprises a processing chamber which is placed inside a container. Inside the chamber is a set of vacuum contacts which support and hold the substrate. The chamber is connected to a shaft which is coupled to a motor. The motor facilitates the spinning of the shaft which in turn rotates the entire chamber and the wafer substrate.

The chamber is sealed by a cover. The cover is attached to a movable shaft which facilitates the opening and the closing of the chamber by raising or lowering the cover from the chamber. The interface between the cover and the chamber side walls should be sufficiently tight so as to preserve a substantially closed environment inside the chamber when the cover is in a closed position. A pin holds the cover to the chamber wall such that the cover rotates with the chamber when the chamber is being rotated.

A dispenser is located above the substrate for dispensing a processing liquid onto the substrate. The processing liquid may be deionized water, chemical etchant or some other liquid depending upon whether the process is washing, etching or some other treatment process. To avoid mixing the liquids, separate nozzles connected to separate pipelines may be provided.

The dispensed chemicals and other processing liquids are removed via an opening in the chamber walls. Air bearing is provided at the interface between the dispenser and the cover so as to allow the cover to rotate around the dispenser while providing a relatively good sealant to prevent gases from entering into and escaping from the chamber.

To prevent an etchant from etching the backside of the substrate and the chemically-sensitive portions of the chamber, a ring of protective wall is provided underneath the substrate to block the etchant from flowing towards the inner portion of the substrate. Furthermore, a backside rinse agent, e.g., deionized water, is continuously supplied through an opening which delivers the agent to the underside of the substrate.

Inside the shaft is a hollow channel for delivering processing gases to the chamber. The gas may be deionized water vapor, $N_2$, isopropylalcohol (IPA), or some other gas depending on whether the chamber is being purged, dried, wetted, or processed in some other manner. A heater is provided to control the temperature inside the chamber by heating the processing gas to the necessary temperature. The humidity inside the chamber is controlled by controlling the percentage of water vapor which is mixed in with the other gases.

To remove the gas which is released into the chamber, the chamber wall has small openings. To facilitate the removal of the gas from the chamber and into the container, the container is provided an exhaust pipe which draws out the gas from the container.

DETAILED DESCRIPTION OF THE INVENTION

Figure 1:
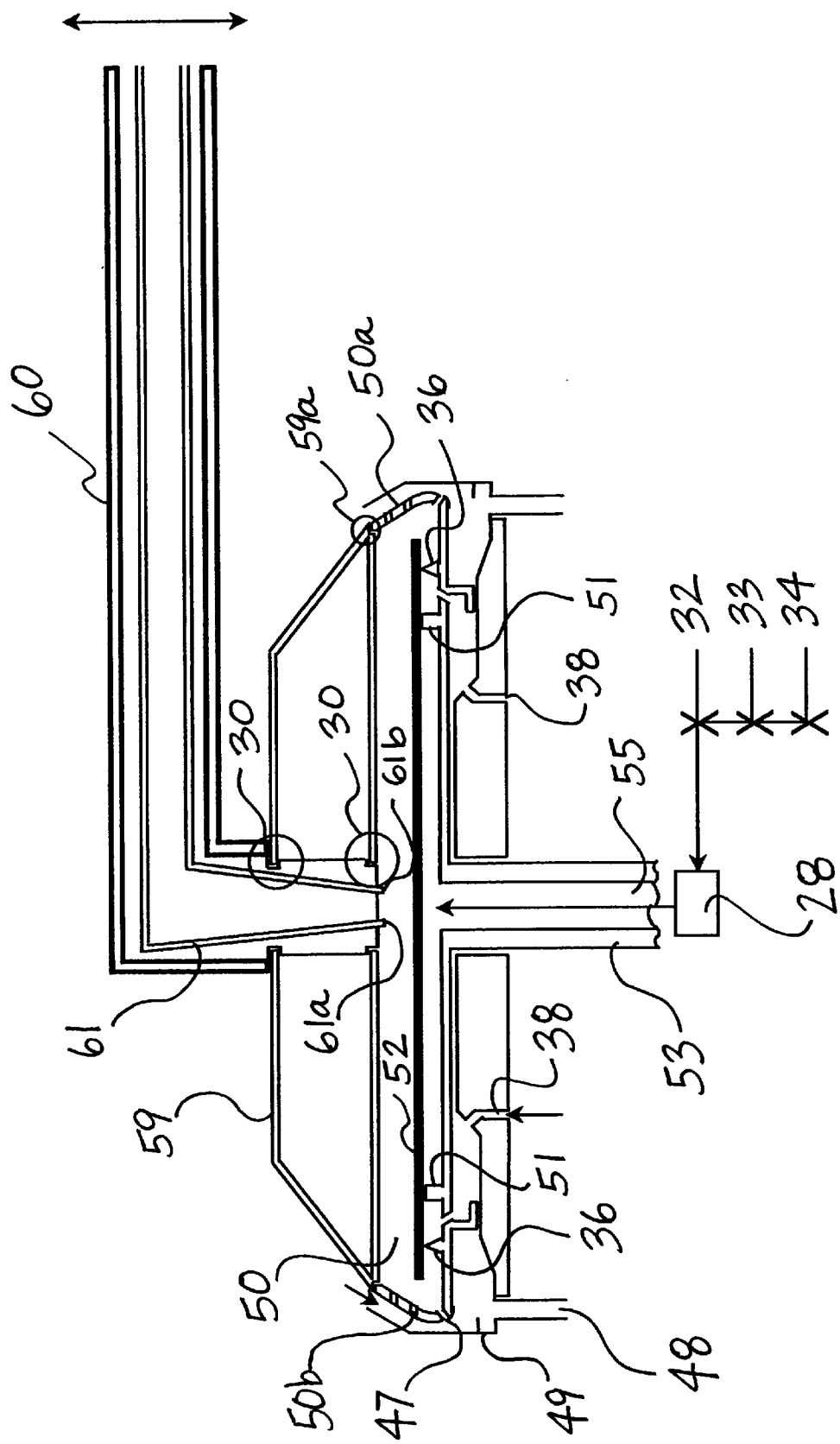
FIG. 1 is a schematic diagram of the present wet processing apparatus.

The present invention is an apparatus for wet processing of substrates in controlled environment. It is single-substrate processing apparatus which is capable of carrying out etching, rinsing, and drying processes all in a single apparatus and in a controlled environment.

FIG. 1 illustrates the preferred embodiment of the present invention. The present wet-processing apparatus comprises a processing chamber 50 which is placed inside a container 49. Inside the chamber 50 is a set of vacuum contacts 51 which support and hold the substrate 52. The chamber 50 is connected to a shaft 53 which is coupled to a motor (not shown). The motor facilitates the spinning of the shaft 53 which in turn rotates the entire chamber 50 and the wafer substrate 52 such that both the chamber 50 and the substrate 52 rotate at a about the same rate. Some relatively minor deviation between the rotational rate of the two, however, is not fatal to the operation.

The chamber 50 is sealed by a cover 59. The cover 59 is attached to a movable shaft 60 which facilitates opening and the closing of the chamber 50 by raising or lowering the cover 59 from the chamber 50. The interface 59a between the cover 59 and the chamber side walls 50a should be sufficiently tight so as to preserve a substantially closed environment inside the chamber 50 when the cover 59 is in a closed position. A pin holds the cover 59 to the chamber wall 50a such that the cover rotates with the chamber 50 when the shaft 53 is rotating.

A dispenser 61 is located above the substrate 52 for dispensing processing liquids onto the substrate 52. The processing liquid may be deionized water, chemical etchant or some other liquid depending upon whether the process is washing, etching or some other treatment process. To avoid mixing the liquids, separate nozzles 61a and 61b connected to separate pipelines may be provided.

The dispensed chemicals and other processing liquids are removed via an opening 47. Air bearing 30 is provided at the interface between the dispenser 61 and the cover 59 so as to allow the cover to rotate around the dispenser 61 while providing a relatively good sealant to prevent gases from entering into and escaping from the chamber 50.

To prevent an etchant from etching the underside 39 of the substrate 52 and the chemically-sensitive portions of the chamber, a ring of protective wall 36 is provided underneath the substrate 52 to block the etchant from flowing towards the inner portion of the substrate 52. Furthermore, a backside rinse agent, e.g., deionized water, is continuously supplied through the opening 38 which delivers the agent to the underside 39 of the substrate 52. But one skilled in the art should keep in mind that while it is desirable to have protective wall 36 and the backside rinse, the present apparatus can operate without these elements.

Inside the shaft 53 is a hollow channel 55 for delivering gases to the chamber 50. The gas may be deionized water vapor 34, $N_2$ 32, isopropylalcohol (IPA) 33, or some other gas depending on whether the chamber is being purged, dried, wetted, or processed in some other manner. A heater 28 is provided to control the temperature inside the chamber by heating the gas, to the necessary temperature. The humidity inside the chamber 50 is controlled by controlling the percentage of water vapor which is mixed in with the other gases.

To remove the gas which is released into the chamber 50, the chamber wall 50a has small openings 50b. To facilitate the removal of the gas from the chamber 50 and into the container 49, the container 49 is provided an exhaust pipe 48 which draws out the gas from the container 49.

The present wet processing apparatus can be used in a manner substantially consistent with the current methods and practices known in the wet processing industry. A sample processing parameters are provided here, however, as a way of fully disclosing a way to make and use the preferred embodiment of the present invention. It is to be understood, however, that these parameters are to be treated as illustrative only, and should not be treated as being the only way that the current apparatus can be used.

To wet process a substrate using the current apparatus, the cover 59 is opened and a wafer substrate is placed onto the vacuum contacts 51. The cover 59 is then lowered to create a substantially closed environment in the chamber 50. An etchant chemical, hydrofluoric acid (HF) for instance, is then dispensed onto the substrate via the dispenser 61. Once the etchant chemical has been dispensed, the substrate, the cover 59, and the entire chamber 50 are all rotated together at 2000 rpm. To prevent drying of the substrate, water vapor is sent through the channel 53 and into the chamber 50.

After sufficient time has elapsed, the substrate is ready for rinsing. Deionized water is dispensed from the dispenser 61 and the substrate, cover 59, and the chamber 50 are again rotated together, but this time at a relatively slow rate of 500 rpm. Again, to prevent drying of the substrate, deionized water vapor is sent through the hollow channel 53. The cover 59 remains closed.

Once the rinsing process is completed, the substrate goes through 2 stages of drying process with the cover 59 still in the closed position. In the first stage, the substrate 52, cover 59, and the chamber 50 are rotated at a relatively high rate of 3000 rpm. During this time the chamber 50 is purged with $N_2$ and IPA vapor. In the second drying stage, the substrate is rotated at a higher rate of 5000 rpm and the chamber is purged with $N_2$ gas. Once the drying process is finished, the rotational movement is halted and the substrate is removed from the chamber 59. During each of the processing steps, an exhaust continually removes gases which are present in the container 49 to provide an equilibrium in the processing chamber 50.

The current apparatus overcomes many of the shortcomings of previous wet processing systems. One of the shortcomings of the previous etching process was the lack of uniformity, that is, uneven etching. One of the main causes was the inability to control the amount of exposure the substrates had with the etchant chemical. This is because the previous systems were open systems where the rate of evaporation of the chemicals from the surface of the substrates could not be precisely controlled. The current invention avoids this problem by enclosing the substrate in a closed environment and precisely controlling the temperature and the humidity inside the processing chamber.

The controlled environment of the present invention also eliminates residual watermarks that are often left on the surface of the substrate after the rinsing cycle. The watermarks are caused by oxidation which occurs when the surface of the substrate is exposed to ambient air. Because in this apparatus, the entire processing is done inside the chamber in a controlled environment, little to no such oxidation occurs.

The current invention also overcomes another cause for failing to achieve uniformity which is the uneven spreading of the etchant chemical in the one-by-by processing systems where the chemical is spread by spinning the substrate.. The spinning action creates turbulence in the surrounding region causing portions of the substrate, especially the edges, to be affected differently than other portions of the substrate. This turbulence, hence, prevents the chemical etchant to be spread evenly throughout the entire surface of the substrate.

The present invention significantly reduces or eliminates this air turbulence by placing the substrate 52 (see FIG. 1) in an enclosed environment and rotating the entire chamber 50, and not just the substrate 52. The chamber 50 is coupled to the spinning action of the substrate 52 so that it rotates at the same rate as the substrate 52 itself. The spinning action of the chamber 50 minimizes the air turbulence in the surrounding region of the substrate 52 providing a much more stable environment for the substrate 52. Empirically, it has been found that rotating the chamber 50 substantially increases the uniformity of the etch of the substrate.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

We claim:

1. A wet processing apparatus for a substrate comprising:
   a substantially enclosed chamber, said chamber having a support means for supporting and holding said substrate;
   a removable cover enclosing at least one side of said chamber;
   a means for delivering processing liquids to said chamber;
   a means for delivering processing gases into said chamber;
   a means for removing said processing gases and liquids out from said chamber;
   and a means for rotating said chamber wherein when said chamber is rotating, said substrate rotates substantially at a same rate as said chamber.

2. The wet processing apparatus as recited in claim 1 further comprising a heater for heating said processing gases.

3. The wet processing apparatus as recited in claim 1 further comprising a protective wall located underneath said substrate for preventing a processing liquid from excessively making contact with an underside of said substrate.

4. The wet processing apparatus as recited in claim 1 further comprising a means for delivering a rinse agent to an underside of said substrate.

5. The wet processing apparatus as recited in claim 3 further comprising a means for delivering a rinse agent to an underside of said substrate between said protective wall and said support means.

6. The wet processing apparatus as recited in claim 1 further comprising a container outside of said chamber, said container having an exhaust for removing gases.

7. The wet processing apparatus as recited in claim 1 wherein said support means is a set of vacuum contacts.

8. The wet processing apparatus as recited in claim 1 wherein said means for delivering processing liquids is a dispenser adapted for delivering deionized water and chemical etchant, said deionized water and chemical etchant being delivered through separate pipes and nozzles.

9. The wet processing apparatus as recited in claim 8 wherein said dispenser is disposed inside a movable shaft, said shaft connected to said cover to lower and raise said cover onto and from said chamber.

10. The wet processing apparatus as recited in claim 9 further comprising air bearing between said dispenser and said cover.

11. The wet processing apparatus as recited in claim 1 wherein said means for delivering processing gases is a channel disposed inside a shaft, said channel leading into said chamber.

12. The wet processing apparatus as recited in claim 1 wherein said processing gases are isopropylalcohol vapor, deionized water vapor, and nitrogen gas.

13. The wet processing apparatus as recited in claim 1 wherein said means for releasing processing liquids and gases comprises openings through a wall of said chamber.

* * * * *